US012807776B2

(12) United States Patent
Takizawa et al.

(10) Patent No.: US 12,807,776 B2
(45) Date of Patent: Nov. 24, 2026

(54) GAS BARRIER LAMINATE, COATING LIQUID FOR PRODUCING SAME, PACKAGING MATERIAL, PACKAGE, AND PACKAGED ARTICLE

(71) Applicant: TOPPAN INC., Tokyo (JP)

(72) Inventors: Seiji Takizawa, Tokyo (JP); Masaki Maeda, Tokyo (JP)

(73) Assignee: TOPPAN INC., Tokyo (JP)

( * ) Notice: Subject to any disclaimer, the term of this patent is extended or adjusted under 35 U.S.C. 154(b) by 502 days.

(21) Appl. No.: 18/222,691

(22) Filed: Jul. 17, 2023

(65) Prior Publication Data

US 2023/0365768 A1 Nov. 16, 2023

Related U.S. Application Data

(63) Continuation of application No. PCT/JP2022/000813, filed on Jan. 13, 2022.

(30) Foreign Application Priority Data

Jan. 18, 2021 (JP) ................................ 2021-005760

(51) Int. Cl.
*C08J 7/048* (2020.01)
*C08J 7/04* (2020.01)
(Continued)

(52) U.S. Cl.
CPC ............ *C08J 7/048* (2020.01); *C08J 7/0423* (2020.01); *C09D 7/20* (2018.01); *C09D 7/61* (2018.01);
(Continued)

(58) Field of Classification Search
None
See application file for complete search history.

(56) References Cited

FOREIGN PATENT DOCUMENTS

| | | | |
|---|---|---|---|
| JP | H06-93133 | A | 4/1994 |
| JP | 2000-289154 | A | 10/2000 |

(Continued)

OTHER PUBLICATIONS

International Searching Authority, "International Search Report," issued in connection with International Patent Application No. PCT/JP2022/000813, dated Apr. 5, 2022.

(Continued)

*Primary Examiner* — Jeffrey D Washville
(74) *Attorney, Agent, or Firm* — Foley & Lardner LLP

(57) ABSTRACT

A coating liquid for producing a gas barrier laminate, the coating liquid containing a carboxyl group-containing polymer (a), polyvalent metal-containing particles (b), a surfactant (c), a specific silicon-containing compound (d), and an organic solvent (e). In the coating liquid: the equivalence ratio ($b_t/a_t$) of the product ($b_t$) of the number of moles and the valency of the polyvalent metal contained in the polyvalent metal-containing particles (b) relative to the number of moles ($a_t$) of carboxyl groups contained in the carboxyl group-containing polymer (a) is 0.45 or more and 0.9 or less; and the molar ratio ($d_t/a_t$) of the number of moles ($d_t$) of the silicon-containing compound (d) relative to the number of moles ($a_t$) of the carboxyl groups is 0.7% or more and 7.5% or less.

20 Claims, 1 Drawing Sheet

(51) Int. Cl.
*C09D 7/20* (2018.01)
*C09D 7/61* (2018.01)
*C09D 7/63* (2018.01)
*C09D 133/08* (2006.01)
*C23C 16/40* (2006.01)

(52) U.S. Cl.
CPC ............. *C09D 7/63* (2018.01); *C09D 133/08* (2013.01); *C23C 16/407* (2013.01); *C08J 2323/00* (2013.01); *C08J 2333/08* (2013.01)

(56) References Cited

FOREIGN PATENT DOCUMENTS

| | | | |
|---|---|---|---|
| JP | 2000-336195 | A | 12/2000 |
| JP | 2005-126528 | A | 5/2005 |
| WO | WO-03/091317 | A1 | 11/2003 |
| WO | WO-2021/256545 | A1 | 12/2021 |

OTHER PUBLICATIONS

International Searching Authority, “Written Opinion,” issued in connection with International Patent Application No. PCT/JP2022/000813, dated Apr. 5, 2022.

GAS BARRIER LAMINATE, COATING LIQUID FOR PRODUCING SAME, PACKAGING MATERIAL, PACKAGE, AND PACKAGED ARTICLE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/000813, filed on Jan. 13, 2022, which in turn claims the benefit of JP 2021-005760, filed Jan. 18, 2021, the disclosures of all which are incorporated herein by reference in its entirety.

TECHNICAL FIELD

The present invention relates to a gas barrier laminate, a coating liquid for producing the same, a packaging material, a package, and a packaged article.

BACKGROUND

Articles such as food products, pharmaceuticals, cosmetics, pesticides, and industrial products can deteriorate in quality due to oxygen when stored for long periods of time. Accordingly, films and sheets with oxygen gas barrier properties are used as packaging materials of such articles.

Conventionally, as such packaging materials, materials provided with aluminum foil as a gas barrier coating layer have been widely used. However, if a packaging material including aluminum foil is used, the contents cannot be seen, and metal detectors cannot be used. Therefore, especially in the fields of food products and pharmaceuticals, the development of transparent packaging materials having excellent gas barrier properties has been sought.

Based on such needs, gas barrier multilayer bodies have been used in which a layer composed of polyvinylidene chloride (PVDC) is provided on a substrate by applying a coating liquid containing PVDC. The layer composed of PVDC is transparent and has gas barrier properties.

However, there is concern that PVDC may generate dioxins when incinerated. Therefore, a shift from PVDC to non-chlorinated materials has been sought. Based on such needs, it has been proposed to use, for example, polyvinyl alcohol (PVA) based polymers instead of PVDC.

A layer made of a PVA-based polymer is dense because of hydrogen bonding of the hydroxyl groups, and exhibits high gas barrier performance in a low-humidity atmosphere. However, a layer made of a PVA-based polymer has a problem that, under a high-humidity atmosphere, the gas barrier properties significantly deteriorate because the hydrogen bonds weaken due to moisture absorption. Therefore, gas barrier multilayer bodies using a layer made of a PVA-based polymer serving as the gas barrier coating layer often cannot be used in packaging materials of food products and the like that contain a large amount of moisture, and have been limited to use as a packaging material of dry objects and the like.

For the purpose of further improving the gas barrier properties, it has been proposed to add an inorganic layered compound to a PVA-based polymer (for example, see PTL 1). However, the addition of an inorganic layered compound does not necessarily improve the water resistance of the PVA-based polymer itself, so the problem remains that the gas barrier properties deteriorate in a high-humidity atmosphere.

In order to improve the gas barrier properties under a high-humidity atmosphere, there have been proposed methods of producing a gas barrier laminate by applying a coating liquid containing a PVA-based polymer and a polymer that can form a crosslinked structure with the PVA-based polymer on a substrate, and then performing heat treatment (for example, see PTL 2 and 3).

However, in order to obtain sufficient gas barrier properties with these techniques, it is necessary to perform heat treatment after application of the coating liquid at a high temperature such as 150° C. or higher to form a crosslinked structure. Such heat treatment causes severe degradation of the substrate, for example, when the material of the substrate is a polyolefin such as polypropylene (OPP) or polyethylene (PE). Therefore, the material of the substrate is limited, and gas barrier multilayer bodies that can be produced under milder conditions are sought.

As a method of forming a gas barrier coating layer, there has also been proposed a method where a layer containing a polycarbonate-based polymer such as polyacrylic acid is formed, and then the polycarbonate-based polymer is ion-crosslinked with polyvalent metal ions (for example, see PTL 4).

This method does not require the high-temperature heat treatment performed in the methods described in PTL 2 and 3. Accordingly, a polyolefin can be used as the substrate. Furthermore, the obtained gas barrier coating layer has excellent gas barrier properties even in a high-humidity atmosphere. Therefore, the gas barrier laminate containing this gas barrier coating layer can also be used in applications where heat sterilization such as boiling and retorting is performed.

However, if the polycarboxylic acid-based polymer and the polyvalent metal compound coexist in the coating liquid, the polycarboxylic acid-based polymer and the polyvalent metal compound are likely to react in the coating liquid and produce a precipitate. If a precipitate occurs in the liquid, it is not possible to form a uniform film. Therefore, in this method, a layer containing a polycarboxylic acid-based polymer and a layer containing a polyvalent metal compound are separately formed when forming the gas barrier coating layer. As a result, when this method is used, the number of steps increases because the gas barrier coating layer has a two-layer structure.

PTL 5 discloses a gas barrier film containing a polycarboxylic acid-based polymer and polyvalent metal compound particles in the same gas barrier coating layer. Here, as the coating liquid used to form the gas barrier coating layer, it has been proposed to set the water content of the coating liquid containing a polycarboxylic acid-based polymer, polyvalent metal compound particles, a surfactant, and an organic solvent to 1,000 ppm or less. Because the coating liquid has a water content of 1,000 ppm or less, the reaction between the polycarboxylic acid-based polymer and the polyvalent metal compound is suppressed.

PTL 5 also states that a film having excellent gas barrier properties under high-humidity conditions can be formed by using the above coating liquid. However, there is a concern that the gas barrier properties of a laminate formed by applying this coating liquid may deteriorate when harsher conditions are applied, or more specifically, when a physical load (heavy-duty use) such as bending is applied after exposure to a high-temperature and high-humidity environment or high-temperature and high-pressure environment such as boiling treatment, retort treatment, or the like.

[Citation List] [Patent Literature] [PTL 1] JP H06-093133 A; [PTL 2] JP 2000-289154 A; [PTL 3] JP 2000-336195 A; [PTL 4] WO2003/091317; [PTL 5] JP 2005-126528 A.

SUMMARY OF THE INVENTION

Technical Problem

The present invention has an object of providing a gas barrier laminate capable of withstanding processing under a high-temperature and high-humidity environment or a high-temperature and high-pressure environment such as retort treatment or boiling treatment, and having excellent resistance to heavy-duty use that enables a high level of gas barrier performance to be maintained thereafter even under heavy-duty use such as bending, and providing a coating liquid for producing the gas barrier laminate, a packaging material, a packaging body, and a packaged article.

Solution to Problem

According to a first aspect of the present invention, provided is a coating liquid for producing a gas barrier laminate, the coating liquid containing a carboxyl group-containing polymer (a), polyvalent metal-containing particles (b), a surfactant (c), a silicon-containing compound (d), and an organic solvent (e), wherein the silicon-containing compound (d) is at least one selected from a group consisting of silane coupling agents represented by general formulas (1) and (2) below and hydrolysates and condensates thereof, an equivalence ratio ($b_t/a_t$) of a product ($b_t$) of a number of moles and a valency of a polyvalent metal contained in the polyvalent metal particles (b) relative to a number of moles ($a_t$) of carboxyl groups contained in the carboxyl group-containing polymer (a) is 0.45 or more and 0.9 or less, and a molar ratio ($d_t/a_t$) of a number of moles ($d_t$) of the silicon-containing compound (d) relative to a number of moles ($a_t$) of the carboxyl groups is 0.7% or more and 7.5% or less. Note that $d_t$ in the molar ratio ($d_t/a_t$) is the number of moles of the silicon-containing compound (d) when converted to the silane coupling agent.

$$Si(OR_1)_3Z_1 \quad (1)$$

$$Si(R_2)(OR_3)_2Z_2 \quad (2)$$

In general formula 1, $R_1$ is an alkyl group having 1 to 6 carbon atoms, which may be the same or different, and $Z_1$ is a group containing an epoxy group, and in general formula (2), $R_2$ is a methyl group, $R_3$ is an alkyl group having 1 to 6 carbon atoms, which may be the same or different, and $Z_2$ is a group containing an epoxy group)

According to a second aspect of the present invention, provided is a coating liquid according to the first aspect, wherein the carboxyl group-containing polymer (a) contains at least a structural unit derived from at least one type of α,β-monoethylenically unsaturated carboxylic acid selected from a group consisting of acrylic acid, methacrylic acid, crotonic acid, itaconic acid, maleic acid, and fumaric acid.

According to a third aspect of the present invention, provided is a coating liquid according to the first or second aspects, wherein a polyvalent metal contained in the polyvalent metal-containing particles (b) is a divalent metal.

According to a fourth aspect of the present invention, provided is a gas barrier laminate comprising a substrate, an inorganic vapor deposition layer which contains an inorganic oxide, and a coating layer provided in this order on at least one primary surface of the substrate, wherein the coating layer contains a carboxyl group-containing polymer (a), polyvalent metal-containing particles (b), a surfactant (c), and a silicon-containing compound (d), the silicon-containing compound (d) is at least one selected from a group consisting of silane coupling agents represented by general formulas (1) and (2) below and hydrolysates and condensates thereof, an equivalence ratio ($b_t/a_t$) of a product ($b_t$) of a number of moles and a valency of a polyvalent metal contained in the polyvalent metal particles (b) relative to a number of moles ($a_t$) of carboxyl groups contained in the carboxyl group-containing polymer (a) is 0.45 or more and 0.9 or less, and a molar ratio ($d_t/a_t$) of a number of moles ($d_t$) of the silicon-containing compound (d) relative to a number of moles ($a_t$) of the carboxyl groups is 0.7% or more and 7.5% or less. Note that $d_t$ in the molar ratio ($d_t/a_t$) is the number of moles of the silicon-containing compound (d) when converted to the silane coupling agent.

$$Si(OR_1)_3Z_1 \quad (1)$$

$$Si(R_2)(OR_3)_2Z_2 \quad (2)$$

In general formula 1, $R_1$ is an alkyl group having 1 to 6 carbon atoms, which may be the same or different, and $Z_1$ is a group containing an epoxy group, and in general formula (2), $R_2$ is a methyl group, $R_3$ is an alkyl group having 1 to 6 carbon atoms, which may be the same or different, and $Z_2$ is a group containing an epoxy group)

According to a fifth aspect of the present invention, provided is a gas barrier laminate according to the fourth aspect, wherein the carboxyl group-containing polymer (a) contains at least a structural unit derived from at least one type of α,β-monoethylenically unsaturated carboxylic acid selected from a group consisting of acrylic acid, methacrylic acid, crotonic acid, itaconic acid, maleic acid, and fumaric acid.

According to a sixth aspect of the present invention, provided is a gas barrier laminate according to the fourth or fifth aspects, wherein a polyvalent metal contained in the polyvalent metal-containing particles (b) is a divalent metal.

According to a seventh aspect of the present invention, provided is a gas barrier laminate according to any one of the fourth to sixth aspects, wherein a film thickness of the coating layer is 230 nm or more and 600 nm or less.

According to an eighth aspect of the present invention, provided is a gas barrier laminate according to any one of the fourth to seventh aspects, further comprising an anchor coat layer between the substrate and the inorganic vapor deposition layer.

According to a ninth aspect of the present invention, provided is a packaging material containing the gas barrier laminate according to any one of the fourth to eighth aspects.

According to a tenth aspect of the present invention, provided is a packaging body containing the packaging material according to the ninth aspect.

According to an eleventh aspect of the present invention, provided is a packaged article containing the packaging body according to the tenth aspect, and contents accommodated in the packaging body.

Advantageous Effects of the Invention

According to the present invention, it is possible to provide a gas barrier laminate capable of withstanding processing under a high-temperature and high-humidity environment or a high-temperature and high-pressure environment such as retort treatment or boiling treatment, and having excellent resistance to heavy-duty use that enables a high level of gas barrier performance to be maintained thereafter even under heavy-duty use such as bending, and to provide a coating liquid for producing the gas barrier laminate, a packaging material, a packaging body, and a packaged article.

DETAILED DESCRIPTION

Figure 1:
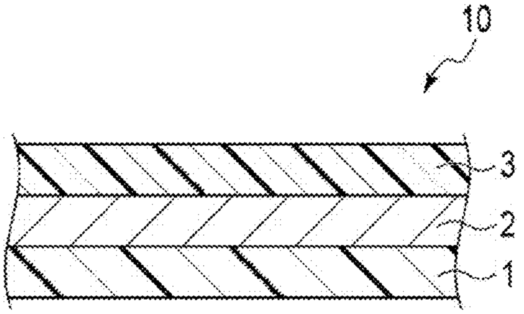
FIG. 1 is a cross-sectional view schematically showing a gas barrier laminate according to an embodiment of the present invention.

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings. Positional relationships such as vertical and horizontal directions are based on the positional relationship illustrated in the drawings unless otherwise specified.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

<Coating Liquid for Producing Gas Barrier Laminate>

The coating liquid for producing a gas barrier laminate according to an embodiment of the present invention (hereinafter, referred to as the "coating liquid of the present embodiment", or simply the "coating liquid") is preferably used in the formation of a coating layer of a gas barrier laminate, and for example, is preferably used in the formation of the coating layer 3 of the gas barrier multilayer bodies 10 and 20 shown in FIG. 1 or FIG. 2 described below. In the following, a layer obtained by drying a coating film composed of the coating liquid according to the present embodiment is sometimes referred to as a "coating liquid-derived coating layer" or simply a "coating layer".

The coating liquid according to the present embodiment contains a carboxyl group-containing polymer (a), polyvalent metal-containing particles (b), a surfactant (c), a silicon-containing compound (d), and an organic solvent (e). In the present embodiment, the polyvalent metal-containing particles (b) are contained in the coating liquid at a blend ratio in which the equivalence ratio ($b_t/a_t$) of a product ($b_t$) of the number of moles and the valency of a polyvalent metal contained in the polyvalent metal particles (b) relative to the number of moles ($a_t$) of carboxyl groups contained in the carboxyl group-containing polymer (a) is 0.45 or more and 0.9 or less. Furthermore, the silicon-containing compound (d) is contained in the coating liquid at a blend ratio in which the molar ratio ($d_t/a_t$) of the number of moles ($d_t$) of the silicon-containing compound (d) relative to the number of moles ($a_t$) of the carboxyl groups becomes 0.7% or more and 7.5% or less.

[Carboxyl Group-Containing Polymer (a)]

The carboxyl group-containing polymer contained in the coating liquid according to the present embodiment is a polymer having two or more carboxyl groups in the molecule, and is also sometimes referred to as a "polycarboxylic acid-based polymer". Representative examples of carboxyl group-containing polymers are homopolymers of carboxyl group-containing unsaturated monomers, copolymers of two or more carboxyl group containing unsaturated monomers, copolymers of carboxyl group-containing unsaturated monomers and other polymerizable monomers, and polysaccharides containing a carboxyl group in the molecule (also referred to as "carboxyl group-containing polysaccharides" or "acidic polysaccharides").

Carboxyl groups include not only free carboxyl groups but also acid anhydride groups (specifically, dicarboxylic acid anhydride groups). An acid anhydride group may be partially ring-opened to form a carboxyl group. Some of the carboxyl groups may be neutralized with an alkali. In this case, the degree of neutralization is preferably 20% or less.

Here, the "degree of neutralization" is a value obtained by the following method. That is, the carboxyl groups can be partially neutralized by adding an alkali (f) to the carboxyl group-containing polymer (a). Here, the ratio of the number of moles (Ft) of alkali (F) to the number of moles (At) of carboxyl groups contained in the carboxyl group-containing polymer (a) is the degree of neutralization.

Furthermore, a graft polymer obtained by graft-polymerizing a carboxyl group-containing unsaturated monomer to a polymer not containing carboxyl groups, such as a polyolefin, can also be used as the carboxyl group-containing polymer. A polymer obtained by hydrolyzing a polymer having a hydrolyzable ester group such as an alkoxycarbonyl group (for example, a methoxycarbonyl group) into a carboxyl group can also be used.

As the carboxyl group-containing unsaturated monomer, an α,β-monoethylenically unsaturated carboxylic acid is preferred. Therefore, the carboxyl group-containing polymer includes homopolymers of an α,β-monoethylenically unsaturated carboxylic acid, copolymers of two or more α,β-monoethylenically unsaturated carboxylic acids, and copolymers of α,β-monoethylenically unsaturated carboxylic acids and another polymerizable monomer. The other polymerizable monomer is typically an ethylenically unsaturated monomer.

Examples of the α,β-monoethylenically unsaturated carboxylic acid include unsaturated monocarboxylic acids such as acrylic acid, methacrylic acid and crotonic acid; unsaturated dicarboxylic acids such as maleic acid, fumaric acid and itaconic acid; unsaturated dicarboxylic acid anhydrides such as maleic anhydride and itaconic anhydride; and mixtures of two or more of these. Among these, at least one α,β-monoethylenically unsaturated carboxylic acid selected from the group consisting of acrylic acid, methacrylic acid, crotonic acid, maleic acid, fumaric acid, and itaconic acid is preferable, and at least one α,β-monoethylenically unsaturated carboxylic acid selected from the group consisting of acrylic acid, methacrylic acid, and maleic acid is more preferable.

Examples of polymerizable monomers, or more specifically, ethylenically unsaturated monomers that can be copolymerized with an α,β-monoethylenically unsaturated carboxylic acid include ethylene; α-olefins such as propylene, 1-butene, 1-pentene, 1-hexene, and 1-octene; saturated carboxylic acid vinyl esters such as vinyl acetate; acrylic acid alkyl esters such as methyl acrylate and ethyl acrylate; methacrylic acid alkyl esters such as methyl methacrylate and ethyl methacrylate; chlorine-containing vinyl monomers such as vinyl chloride and vinylidene chloride; fluorine-containing vinyl monomers such as vinyl fluoride and vinylidene fluoride; unsaturated nitriles such as acrylonitrile and methacrylonitrile; aromatic vinyl monomers such as styrene and α-methylstyrene; and itaconic acid alkyl esters. These ethylenically unsaturated monomers can be used alone or in combination of two or more. In addition, when the carboxyl group-containing polymer is a copolymer of an α,β-monoethylenically unsaturated carboxylic acid and a saturated carboxylic acid vinyl ester such as vinyl acetate, it is possible to use a copolymer obtained by saponifying the copolymer to convert the saturated carboxylic acid vinyl ester units to vinyl alcohol units.

Examples of carboxyl group-containing polysaccharides include acidic polysaccharides having a carboxyl group in the molecule, such as alginic acid, carboxymethylcellulose, and pectin. These acidic polysaccharides can be used alone or in combination of two or more. Furthermore, acidic polysaccharides can also be used in combination with (co) polymers of α,β-monoethylenically unsaturated carboxylic acids.

When the carboxyl group-containing polymer is a copolymer of an α,β-monoethylenically unsaturated carboxylic acid and another ethylenically unsaturated monomer, from the viewpoint of the gas barrier properties, the hot water resistance, and the water vapor resistance, the ratio of the number of moles of the α,β-monoethylenically unsaturated carboxylic acid monomer to the total number of moles of the monomers in the copolymer is 60 mol % or more, more preferably 80 mol % or more, and particularly preferably 90 mol % or more.

From the viewpoint that carboxyl group-containing polymers have excellent gas barrier properties, moisture resistance, water resistance, hot water resistance, and water vapor resistance, and a film having excellent gas barrier properties under a high-humidity environment can be easily obtained, a homopolymer or copolymer obtained by polymerization of only monoethylenically unsaturated carboxylic acids is preferable. When the carboxyl group-containing polymer is a (co)polymer consisting only of α,β-monoethylenically unsaturated carboxylic acids, preferable specific examples include homopolymers and copolymers obtained by polymerizing at least one α,β-monoethylenically unsaturated carboxylic acid selected from the group consisting of acrylic acid, methacrylic acid, crotonic acid, maleic acid, fumaric acid, and itaconic acid, and mixtures of two or more of these. Among these, more preferable are homopolymers and copolymers of at least one α,β-monoethylenically unsaturated carboxylic acid selected from the group consisting of acrylic acid, methacrylic acid and maleic acid.

As the carboxyl group-containing polymer, polyacrylic acid, polymethacrylic acid, polymaleic acid, and mixtures of two or more of these are particularly preferable. Alginic acid is preferred as the acidic polysaccharide. Among these, polyacrylic acid is particularly preferred because it is relatively easy to obtain and it is easy to obtain a film having excellent physical properties.

The number average molecular weight of the carboxyl group-containing polymer is not particularly limited, but from the viewpoint of film formability and film physical properties, the number average molecular weight is preferably in the range of 2,000 to 10,000,000, more preferably in the range of 5,000 to 1,000,000, and even more preferably in the range of 10,000 to 500,000.

Here, the “number average molecular weight” is a value obtained by measurement by gel permeation chromatography (GPC). A GPC measurement generally measures the number average molecular weight of a polymer in terms of standard polystyrene.

[Polyvalent Metal-Containing Particles (b)]

The polyvalent metal-containing particles contained in the coating liquid according to the present embodiment are particles containing at least one type of polyvalent metal having a metal ion with a valence of 2 or more. The polyvalent metal-containing particles may be particles composed of a polyvalent metal of which the metal ion has a valence of 2 or more, or may be particles composed of a compound of a polyvalent metal in which the metal ion has a valence of 2 or more, or a mixture of these.

Specific examples of polyvalent metals include group 2A metals of the short period periodic table such as beryllium, magnesium, and calcium; transition metals such as titanium, zirconium, chromium, manganese, iron, cobalt, nickel, copper, and zinc; and aluminum, but are not limited to these.

The polyvalent metal is preferably a divalent metal. Moreover, it is preferable that the polyvalent metal forms compounds.

Specific examples of the polyvalent metal compound include polyvalent metal oxides, hydroxides, carbonates, organic acid salts, and inorganic acid salts, but are not limited to these. Examples of organic acid salts include acetates, oxalates, citrates, lactates, phosphates, phosphites, hypophosphites, stearates, and monoethylenically unsaturated carboxylic acids, but are not limited to these. Examples of inorganic acid salts include chlorides, sulfates, and nitrates, but are not limited to these. Alkylalkoxides of polyvalent metals can also be used as the polyvalent metal compound. These polyvalent metal compounds can be used alone or in combination of two or more.

Among polyvalent metal compounds, compounds of beryllium, magnesium, calcium, copper, cobalt, nickel, zinc, aluminum, and zirconium are preferable from the viewpoint of the dispersion stability of the coating liquid and the gas barrier properties of the laminate formed from the coating liquid, and compounds of divalent metals such as beryllium, magnesium, calcium, copper, zinc, cobalt, and nickel are more preferable.

Preferred divalent metal compounds include oxides such as zinc oxide, magnesium oxide, copper oxide, nickel oxide, and cobalt oxide; carbonates such as calcium carbonate; organic acid salts such as calcium lactate, zinc lactate, and calcium acrylate; alkoxides such as magnesium methoxide, but are not limited to these.

The polyvalent metal or polyvalent metal compound is used as particles, and the particle form is maintained even in the coating liquid. From the viewpoint of the dispersion stability of the coating liquid and the gas barrier properties of the laminate formed from the coating liquid, the average particle size of the polyvalent metal-containing particles, as an average particle size in the coating liquid, is preferably in the range of 10 nm to 10 μm (or 10,000 nm), more preferably in the range of 12 nm to 1 μm (or 1,000 nm), still more preferably in the range of 15 nm to 500 nm, and particularly preferably in the range of 15 nm to 50 nm.

If the average particle size of the polyvalent metal-containing particles in the coating liquid is too large, the uniformity of the film thickness of the coating layer, the surface flatness, and the ionic cross-linking reactivity with the carboxyl group-containing polymer tends to become insufficient. If the average particle size of the polyvalent metal-containing particles is too small, the ionic cross-linking reaction with the carboxyl group-containing polymer may proceed too rapidly. Furthermore, it is difficult to uniformly disperse ultrafine particles having a particle size of less than 10 nm in the coating liquid.

When the sample is a dry solid, the average particle size of the polyvalent metal-containing particles can be determined by measuring and counting using a scanning electron microscope or a transmission electron microscope. The average particle size of the polyvalent metal-containing particles in the coating liquid can be measured by a light scattering method [reference: "Microparticle Engineering Systems" Vol. I, pp. 362-365, Fuji Techno System (2001)].

The polyvalent metal-containing particles in the coating liquid exist as primary particles, secondary particles, or a mixture of these, and in many cases, it is presumed that they exist as secondary particles based on the average particle size.

[Surfactant (c)]

A surfactant is used in the coating liquid according to the present embodiment in order to improve the dispersibility of the polyvalent metal-containing particles. A surfactant is a compound having both a hydrophilic group and a lipophilic group in the molecule. Surfactants include anionic, cationic, and amphoteric ionic surfactants and nonionic surfactants. Any type of surfactant may be used in the coating liquid described above.

Examples of anionic surfactants include carboxylic acid-based, sulfonic acid-based, sulfate-based, and phosphate ester-based surfactants. Examples of carboxylic acid-based anionic surfactants include aliphatic monocarboxylates, polyoxyethylene alkyl ether carboxylates, N-acylsarcosinates, and N-acylglutamates. Examples of sulfonic acid-based anionic surfactants include dialkylsulfosuccinates, alkanesulfonates, alpha-olefinsulfonates, linear alkylbenzenesulfonates, alkyl (branched) benzenesulfonates, and naphthalenesulfonate-formaldehyde condensates, alkyl naphthalene sulfonates, and N-methyl-N-acyl taurate salts. Examples of sulfate ester-based anionic surfactants include alkyl sulfates, polyoxyethylene alkyl ether sulfates, and sulfuric acid ester salts of fats and oils. Examples of phosphate ester-based anionic surfactants include alkyl phosphate-based surfactants, polyoxyethylene alkyl ether phosphates, and polyoxyethylene alkylphenyl ether phosphates.

Examples of cationic surfactants include alkylamine salt-based and quaternary ammonium salt-based surfactants. Examples of alkylamine salt-based cationic surfactants include monoalkylamine salts, dialkylamine salts, and trialkylamine salts. Examples of quaternary ammonium salt-based cationic surfactants include halogenated (chlorinated, brominated or iodinated) alkyltrimethylammonium salts and alkylbenzalkonium chlorides.

Examples of amphoteric surfactants include carboxybetaine-based, 2-alkylimidazoline derivative-based, glycine-based, and amine oxide-based surfactants. Examples of carboxybetaine-based amphoteric surfactants include alkylbetaines and fatty acid amidopropylbetaines. Examples of amphoteric surfactants of 2-alkylimidazoline derivatives include 2-alkyl-N-carboxymethyl-N-hydroxyethylimidazolinium betaines. Examples of glycine-based amphoteric surfactants include alkyl or dialkyl diethylenetriaminoacetic acids. Examples of amino oxide-based amphoteric surfactants include alkylamine oxides.

Examples of nonionic surfactants include ester-based, ether-based, ester ether-based, and alkanolamide-based surfactants. Examples of ester-based nonionic surfactants include glycerin fatty acid esters, sorbitan fatty acid esters, and sucrose fatty acid esters. Examples of ether-based nonionic surfactants include polyoxyethylene alkyl ethers, polyoxyethylene alkylphenyl ethers, and polyoxyethylene polyoxypropylene glycols. Examples of ester ether-based nonionic surfactants include fatty acid polyethylene glycols and fatty acid polyoxyethylene sorbitans. Examples of alkanolamide-based nonionic surfactants include fatty acid alkanolamides.

Surfactants with polymer backbones such as a styrene-acrylic acid copolymer can also be used.

Among these surfactants, anionic surfactants such as phosphate esters and surfactants having a polymer backbone such as a styrene-acrylic acid copolymer are preferable.

[Silicon-Containing Compound (d)]

The coating liquid according to the present embodiment contains the silicon-containing compound (d) in order to increase the peeling strength of the coating layer. The silicon-containing compound (d) contained in the coating liquid represents one or more types of compounds selected from the group consisting of silane coupling agents represented by general formula (1) below, silane coupling agents represented by general formula (2) below, and hydrolysates and condensates of these silane coupling agents.

$$Si(OR_1)_3Z_1 \quad (1)$$

$$Si(R_2)(OR_3)_2Z_2 \quad (2)$$

In general formula 1, $R_1$ is an alkyl group having 1 to 6 carbon atoms, which may be the same or different, and $Z_1$ is a group containing an epoxy group. In general formula (2), $R_2$ is a methyl group, $R_3$ is an alkyl group having 1 to 6 carbon atoms, which may be the same or different, and $Z_2$ is a group containing an epoxy group.

A silane coupling agent readily undergoes hydrolysis, and readily undergoes a condensation reaction in the presence of an acid or alkali. Therefore, in the coating liquid described above, the silicon-containing compound is rarely present in only the silane coupling agent form represented by general formulas (1) and (2), only in the hydrolysate form, or only in the condensate form. That is, in the coating liquid according to the present embodiment, the silicon-containing compound is usually at least one of the silane coupling agent represented by general formula (1) and the silane coupling agent represented by general formula (2), and exists as a mixture with the hydrolysate form and the condensate form.

Each $R_1$ in general formula (1) and $R_3$ in general formula (2) may be an alkyl group having 1 to 6 carbon atoms, and is preferably a methyl group or an ethyl group. Each $Z_1$ in general formula (1) and $Z_2$ in general formula (2) may be a group containing an epoxy group.

Specific examples of the silane coupling agent represented by general formulas (1) and (2) include 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane and the like, and among these, 3-glycidoxypropylmethyldimethoxysilane and 3-glycidoxypropyltrimethoxysilane are preferable. These silane coupling agents may be used singly or in combination of two or more.

The hydrolysate of the silane coupling agents represented by general formulas (1) and (2) may be a partial hydrolysate, a complete hydrolysate, or a mixture thereof.

The condensate contained in the coating liquid according to the present embodiment as at least part of the silicon-containing compound is two or more of a hydrolytic condensate of the silane coupling agent represented by general formula (1), a hydrolytic condensate of the silane coupling agent represented by general formula (2), and a condensate of a hydrolysate of the silane coupling agent represented by general formula (1) and a hydrolysate of the silane coupling agent represented by general formula (2). These hydrolytic condensates are produced by the following reactions. That is, the silane coupling agent is firstly hydrolyzed. As a result, one or more of the alkoxy groups contained in the molecule of the silane coupling agent is substituted with a hydroxyl group to form a hydrolysate. Then, condensation of these hydrolysates forms compounds in which silicon atoms (Si) are bonded together via oxygen. The hydrolytic condensate is obtained as a result the condensation being repeated.

[Organic Solvent (e)]

The coating liquid according to the present embodiment uses an organic solvent as a solvent or dispersion medium. As the organic solvent, a polar organic solvent that dissolves the carboxyl group-containing polymer is generally used, but an organic solvent without a polar group (a heteroatom or a group of atoms having a heteroatom) may be used together with a polar organic solvent.

Examples of organic solvents that can be preferably used include alcohols such as methanol, ethanol, isopropanol, n-propanol, and n-butanol; and other polar organic solvents such as dimethylsulfoxide, N,N-dimethylacetamide, N,N-dimethylformamide, N-methyl-2-pyrrolidone, tetramethylurea, hexamethylphosphoric triamide, and γ-butyrolactone.

In addition to the above polar organic solvents, hydrocarbons such as benzene, toluene, xylene, hexane, heptane, and octane; ketones such as acetone and methyl ethyl ketone; halogenated hydrocarbons such as dichloromethane; esters such as methyl acetate; and ethers such as diethyl ether can be used as appropriate. Hydrocarbons such as benzene that do not have a polar group are generally used in combination with polar organic solvents.

The coating liquid according to the present embodiment may contain only an organic solvent as a solvent or dispersion medium, but may also further contain water. As a result of including water, the solubility of the carboxyl group-containing polymer can be improved, and the coatability and workability of the coating liquid can be improved. The water content of the coating liquid in terms of mass fraction may be 100 ppm or more, 1,000 ppm or more, 1,500 ppm or more, or 2,000 ppm or more.

The water content of the coating liquid according to the present embodiment in terms of mass fraction is preferably 50,000 ppm or less, more preferably 10,000 ppm or less, and even more preferably 5,000 ppm or less.

[Composition]

The coating liquid according to the present embodiment contains the carboxyl group-containing polymer (a), the polyvalent metal-containing particles (b), the surfactant (c), the silicon-containing compound (d), and the organic solvent (e), and is a dispersion in which the polyvalent metal-containing particles (b) are dispersed.

Equivalence Ratio of Carboxyl Group-Containing Polymer (a) and Polyvalent Metal-Containing Particles (b)

In the coating liquid according to the present embodiment, the polyvalent metal-containing particles (b) are contained at a blend ratio in which the equivalence ratio relative to the carboxyl group-containing polymer (a) is 0.45 or more and 0.9 or less. Here, the equivalence ratio of the polyvalent metal-containing particles (b) relative to the carboxyl group-containing polymer (a) is the ratio ($b_t/a_t$) of the product ($b_t$) of the number of moles and the valency of the polyvalent metal contained in the polyvalent metal particles (b) relative to the number of moles ($a_t$) of carboxyl groups contained in the carboxyl group-containing polymer (a).

In the present embodiment, the equivalence ratio ($b_t/a_t$) is 0.45 or more and 0.9 or less, preferably 0.5 or more and 0.8 or less, and more preferably 0.6 or more and 0.7 or less. When the equivalence ratio ($b_t/a_t$) is within the above range, the crosslink formation between the carboxyl group-containing polymer (a) and the polyvalent metal ions contained in the polyvalent metal-containing particles (b) proceeds to an appropriate extent, which results in a coating liquid-derived coating layer that is not too soft or too hard, which improves the resistance of the gas barrier laminate to heavy-duty use.

The equivalence ratio ($b_t/a_t$) of the carboxyl group-containing polymer (a) and the polyvalent metal-containing particles (b) can be obtained, for example, as follows. A case where the carboxyl group-containing polymer (a) is polyacrylic acid and the polyvalent metal-containing particles (b) are magnesium oxide will be described as an example.

Polyacrylic acid has a monomer unit molecular weight of 72 and has one carboxyl group per monomer molecule. Therefore, the amount of carboxyl groups in 100 g of polyacrylic acid is 1.39 moles. The fact that the equivalence ratio ($b_t/a_t$) of a coating liquid containing 100 g of polyacrylic acid is 1.0 means that the coating liquid contains the amount of magnesium oxide that neutralizes 1.39 moles of the carboxyl groups. Therefore, in order to set the equivalence ratio ($b_t/a_t$) of a coating liquid containing 100 g of polyacrylic acid to 0.6 as described above, the amount of magnesium oxide that neutralizes 0.834 moles of the carboxyl groups is added to the coating liquid. Here, the valence of magnesium is two, and the molecular weight of magnesium oxide is 40. Therefore, in order to set the equivalence ratio ($b_t/a_t$) of a coating liquid containing 100 g of polyacrylic acid to 0.6 as described above, 16.68 g (0.417 moles) of magnesium oxide is added to the coating liquid.

Molar Ratio of Carboxyl Group-Containing Polymer (a) and Silicon-Containing Compound (d)

In the coating liquid according to the present embodiment, the silicon-containing compound (d) is contained at a blend ratio in which the molar ratio relative to the carboxyl group-containing polymer (a) becomes 0.7% or more and 7.5% or less. Here, the molar ratio of the silicon-containing compound (d) relative to the carboxyl group-containing polymer (a) is the molar ratio ($d_t/a_t$) of the number of moles ($d_t$) of the silicon-containing compound (d) relative to the number of moles (a) of carboxyl groups contained in the carboxyl group-containing polymer (a). In the molar ratio ($d_t/a_t$), $d_t$ is the number of moles of the silicon-containing compound (d) when converted to the silane coupling agent. Furthermore, $a_t$ is the number of moles calculated using the same calculation method as the value at in the equivalence ratio ($b_t/a_t$) of the carboxyl group-containing polymer (a) and the polyvalent metal-containing particles (b).

In the present embodiment, the molar ratio ($d_t/a_t$) is 0.7% or more and 7.5% or less, preferably 0.9% or more and 6.1% or less, and more preferably 2% or more and 5% or less. If the amount of the silicon-containing compound (d) added is too small, the adhesion of the coating layer will be low and the resistance to heavy-duty use will be low. On the other hand, if the amount of the silicon-containing compound (d) added is too large, the silicon-containing compound itself becomes a foreign substance, and the oxygen barrier properties will deteriorate.

The surfactant (c) is used in an amount sufficient to stably disperse the polyvalent metal-containing particles (b). The concentration of the surfactant (c) in the coating liquid is generally 0.0001 to 70% by weight, preferably 0.001 to 60% by mass, and more preferably 0.1 to 50% by mass.

If the surfactant (c) is not added, it becomes difficult to disperse the polyvalent metal-containing particles (b) in the coating liquid such that the average particle size is sufficiently small. As a result, it is difficult to obtain a coating liquid in which the polyvalent metal-containing particles (b) are uniformly dispersed, and it becomes difficult to form a coating film having a uniform thickness when applied on a substrate.

[Method for Producing Coating Liquid]

To produce the coating liquid, a carboxyl group-containing polymer solution is prepared by uniformly dissolving the carboxyl group-containing polymer (a) in the organic solvent (e), and then adding the silicon-containing compound (d) thereto.

Then, the polyvalent metal-containing particles (b), the surfactant (c), and the organic solvent (e) are mixed and, if necessary, subjected to dispersion treatment to prepare a dispersion. The dispersion treatment is carried out so that the average particle size of the polyvalent metal-containing particles (b) becomes a predetermined value. If the average particle size of the polyvalent metal-containing particles (b) in the mixed solution before the dispersion treatment is 10 μm or less, the dispersion treatment may be omitted, but is preferably carried out even in this case. Aggregation of the polyvalent metal-containing particles can be resolved by performing the dispersion treatment, which stabilizes the coating liquid and also increases the transparency of the gas barrier laminate obtained by applying the coating liquid. Further, when the coating liquid is applied and the coating film is dried, crosslinking of the carboxyl group-containing polymer (a) and the polyvalent metal ions proceeds more easily, and a gas barrier laminate having good gas barrier properties is more easily obtained.

Examples of dispersion treatment methods include methods using a high-speed agitator, a homogenizer, a ball mill, or a bead mill. In particular, when dispersion is performed using a ball mill or a bead mill, the dispersion can be performed with high efficiency, such that a coating liquid with a stable dispersion state can be obtained in a relatively short period of time. In this case, the diameter of the balls or beads should be small, preferably 0.1 to 1 mm.

The coating liquid can be prepared by mixing the carboxyl group-containing polymer and the dispersion of the polyvalent metal-containing particles prepared as described above. In addition, the silicon-containing compound (d) may be omitted from the carboxyl group-containing polymer solution. In this case, the silicon-containing compound (d) may be mixed in, for example, when the carboxyl group-containing polymer solution and the dispersion of the polyvalent metal-containing particles (b) are mixed.

In the coating liquid according to the present embodiment, the total concentration of the components other than the organic solvent is preferably 0.1 to 60% by mass, more preferably 0.5 to 25% by mass, and particularly preferably 1 to 20% by mass so that a coating film of the desired film thickness and a high workability of the coating layer is obtained.

The coating liquid according to the present embodiment may contain, as necessary, various additives such as other polymers, thickeners, stabilizers, ultraviolet absorbers, antiblocking agents, softeners, inorganic layered compounds (such as montmorillonite), and colorants (dyes and pigments).

<Gas Barrier Laminate>

The gas barrier laminate according to the present embodiment comprises a substrate, an inorganic vapor deposition layer containing an inorganic oxide on at least one primary surface of the base material, and a coating layer, wherein the coating layer is a coating layer derived from the coating liquid described above. FIG. 1 is a cross-sectional view schematically showing a gas barrier laminate according to the present embodiment, and the gas barrier laminate 10 is provided with a substrate 1, an inorganic vapor deposition layer 2 containing an inorganic oxide, and a coating layer 3.

[Substrate]

There are no particular restrictions on the substrate of the gas barrier laminate described above, and various types of substrates can be used. The material forming the substrates is not particularly limited, and various types of materials such as plastic or paper can be used.

The substrate may be single-layered and made of a single material, or multi-layered and made of a plurality of materials. Examples of multi-layered substrates include substrates in which a film made of a plastic is laminated on a paper.

Among the materials described above, plastics are preferred as the material for the substrate because they can be molded into various shapes and can be used in a wider range of applications by imparting gas barrier properties.

The plastic is not particularly limited, and examples include polyolefin resins such as polyethylene and polypropylene; polyester-based resins such as polyethylene terephthalate, polyethylene-2,6-naphthalate, polybutylene terephthalate and copolymers thereof; polyamide-based resins such as nylon-6, nylon-66, nylon-12, meta-xylylene adipamide and copolymers thereof, styrene-based resins such as polystyrene, styrene-butadiene copolymer and styrene-butadiene-acrylonitrile copolymer; poly(meth)acrylate ester; polyacrylonitrile; polyvinyl acetate; ethylene-vinyl acetate copolymer; ethylene-vinyl alcohol copolymer; polycarbonate; polyarylate; regenerated cellulose; polyimide; polyether imide; polysulfone; polyether sulfone; polyether ketone; and ionomer resins.

When the gas barrier laminate is used as a food packaging material, the substrate is preferably made of polyethylene, polypropylene, polyethylene terephthalate, nylon-6 or nylon-66.

As the plastic constituting the substrate, one type of plastic may be used alone, or two or more types of plastics may be blended and used.

Additives may be blended into the plastic. Additives can be appropriately selected from known additives such as pigments, oxidation inhibitors, antistatic agents, ultraviolet absorbers and lubricants, depending on the application. These additives may be used singly or in combination of two or more.

The form of the substrate is not particularly limited, and examples include a film, a sheet, a cup, a tray, a tube, and a bottle. Among these, a film is preferable. If the substrate is a film, the film may be a stretched film, or may be an unstretched film.

Although the thickness of the substrate is not particularly limited, from the viewpoint of the mechanical strength of the obtained gas barrier laminate and processing suitability, the thickness is preferably in the range of 1 and 200 μm, and more preferably in the range of 5 and 100 μm.

The surface of the substrate may be subjected to plasma treatment, corona treatment, ozone treatment, flame treatment, radical activation treatment with an ultraviolet (UV) or electron beam, and the like, such that the coating liquid can be applied without being repelled by the substrate. The treatment method is appropriately selected depending on the type of substrate.

[Inorganic Vapor Deposition Layer]

The gas barrier laminate according to the present embodiment is provided with an inorganic vapor deposition layer between the substrate and the coating layer. As a result, the gas barrier properties of the gas barrier laminate including the coating layer can be further enhanced.

The inorganic vapor deposition layer contains an inorganic oxide. Examples of the inorganic oxide include aluminum oxide, silicon oxide, magnesium oxide, and tin oxide. Among these, aluminum oxide, silicon oxide, magnesium oxide, or a mixture of any two or more of these is preferable from the viewpoint achieving both transparency and gas barrier properties.

The thickness of the inorganic vapor deposition layer, for example, may be in the range of 5 to 100 nm, or in the range from 10 to 50 nm. It is preferable from the viewpoint of forming a uniform thin film that the thickness of the inorganic vapor deposition layer is 5 nm or more. When the thin film serving as the gas barrier material is uniform, the functions required of the gas barrier material can be sufficiently achieved. It is preferable from the viewpoint of the flexibility of the thin film that the thickness of the inorganic vapor deposition layer is 100 nm or less. If the gas barrier material has poor flexibility, it may crack due to external factors such as bending and stretching.

[Coating Layer]

The coating layer is formed from the coating liquid described above, and more specifically, by coating the coating liquid described above on the inorganic vapor deposition layer and then drying the coating film. As mentioned above, in the coating layer, the equivalence ratio ($b_t/a_t$) of the polyvalent metal-containing particles (b) relative to the carboxyl group-containing polymer (a), and the molar ratio ($d_t/a_t$) of the silicon-containing compound (d) relative to the carboxyl group-containing polymer (a), are in a specific range. Because the gas barrier laminate is provided with the coating layer derived from the coating liquid described above, it can withstand processing under a high-temperature and high-humidity environment or a high-temperature and high-pressure environment such as retort treatment or boiling treatment, and exhibits excellent resistance to heavy-duty use that enables a high level of gas barrier performance to be maintained thereafter even under heavy-duty use such as bending.

From the viewpoint of the gas barrier properties and resistance to heavy-duty use after high-temperature and high-pressure treatment, the thickness of the coating layer is preferably 230 nm or more and 600 nm or less, more preferably 270 nm or more and 520 nm or less, and even more preferably 300 nm or more and 450 nm or less.

[Other Layers]

The gas barrier laminate according to the present embodiment may further include, as necessary, one or more layers other than the substrate, the inorganic vapor deposition layer, and the coating layer.

For example, although the gas barrier laminate according to the present embodiment may be equipped with only the coating layer described above as the gas barrier coating layer, one or more other layers may be included in addition to the coating layer. For example, a layer made of an inorganic compound such as aluminum oxide, silicon oxide, or aluminum may be formed on the surface of the substrate by a sputtering method, an ion plating method, or the like.

Furthermore, the gas barrier laminate according to the present embodiment may be further provided with an anchor coat layer between the substrate and the inorganic vapor deposition layer, or between the inorganic vapor deposition layer and the coating layer for the purpose of increasing the adhesion between layers, or allowing the coating liquid for forming the coating layer to be coated without being repelled by the inorganic vapor deposition layer.

Figure 2:
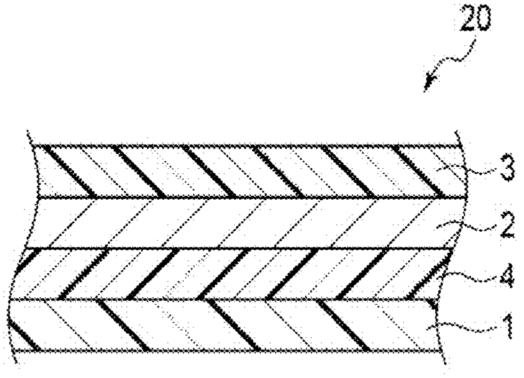
FIG. 2 is a cross-sectional view schematically showing a gas barrier laminate according to another embodiment of the present invention.

FIG. 2 is a cross-sectional view schematically showing a gas barrier laminate according to another embodiment of the present invention. The gas barrier laminate 20 shown in FIG. 2 further includes an anchor coat layer 4 between the substrate 1 and the inorganic vapor deposition layer 2 in contrast to the gas barrier laminate 10 shown in FIG. 1.

The anchor coat layer can be formed by a conventional method using a known anchor coat liquid. Examples of anchor coat liquids include those containing a resin such as polyurethane resin, acrylic resin, melamine resin, polyester resin, phenol resin, amino resin, and fluorine resin.

The anchor coat liquid may further contain an isocyanate compound in addition to the resin for the sake of improving the adhesiveness or hot water resistance. The isocyanate compound only has to have one or more isocyanate groups in the molecule, and examples include hexamethylene diisocyanate, xylylene diisocyanate, isophorone diisocyanate, and tolylene diisocyanate.

The anchor coat liquid may further contain a liquid medium for dissolving or dispersing the resin and the isocyanate compound.

The thickness of the anchor coat layer is not particularly limited. The thickness of the anchor coat layer may be, for example, in the range of 0.01 to 2 μm, or in the range of 0.05 to 1 μm. If the film thickness is less than 0.01 μm, it is extremely thin, so there is a possibility that the performance as an anchor coat layer may not be sufficiently exhibited. On the other hand, it is preferable from the viewpoint of flexibility that the film thickness is 2 μm or less. If the flexibility is lowered, the anchor coat layer may crack due to external factors.

The gas barrier laminate according to the present embodiment may further include, as necessary, additional layers laminated via an adhesive on the coating layer or on a surface of the substrate or inorganic vapor deposition layer, or may further include additional layers formed by extrusion lamination of adhesive resins.

The additionally laminated layers can be appropriately selected according to purposes such as imparting strength, imparting sealing properties, imparting ease of opening when sealed, imparting design properties, importing light blocking properties, and imparting moisture resistance, and although the materials are not limited, examples include the same materials as the plastics described above for the substrate. Alternatively, paper, aluminum foil, or the like may be used.

The thickness of the additionally laminated layers is preferably in the range of 1 to 1000 μm, more preferably in the range of 5 to 500 μm, still more preferably in the range of 5 to 200 μm, and particularly preferably in the range of 5 to 150 μm.

The additionally laminated layers may be of a single type, or of two or more types.

The gas barrier laminate according to the present embodiment may further include a printed layer as necessary. The printed layer may be formed on the coating layer provided on the substrate, or may be formed on a surface of the substrate where the coating layer is not provided. Furthermore, if an additional layer is laminated, the printed layer may be formed on the additional laminated layer.

[Method for Producing Gas Barrier Laminate]

The gas barrier laminate according to the present embodiment can be produced by a production method including a step for forming an inorganic vapor deposition layer, and a step for forming a coating layer using the coating liquid described above. The production method can further include, as necessary, a step for forming additional layers such as an anchor coat layer and/or a step for forming a printed layer or the like.

As an example of a production method of the gas barrier laminate according to the present embodiment, a production method of the gas barrier laminate 20 shown in FIG. 2 will be described below.

In the production method of the gas barrier laminate 20, the anchor coat layer 4 is formed on the substrate 1. The anchor coat layer 4 can be formed by coating the substrate 1 with the anchor coat liquid described above, and then drying the formed coating film. The method of applying the anchor coat liquid is not particularly limited, and known printing methods such as offset printing, gravure printing, and silk screen printing, and known coating methods such as roll coating, knife edge coating, and gravure coating can be used. As a result of drying the formed coating film, solvent removal and curing proceed, and the anchor coat layer 4 is formed.

In the method for producing of the gas barrier laminate 20, the inorganic vapor deposition layer 2 is formed on the anchor coat layer 4. Various methods such as the vacuum deposition method, the sputtering method, the ion plating method, and the chemical vapor deposition (CVD) method are known as methods of forming the inorganic vapor deposition layer 2, and while any of these methods can be used, it is usually formed using the vacuum deposition method.

Examples of the heating means of a vacuum vapor deposition device using the vacuum vapor deposition method include an electron beam heating system, a resistance heating system, an induction heating system, and the like, and any of these may be used.

In addition, in order to improve the adhesion of the inorganic vapor deposition layer 2 to the anchor coat layer 4 and the denseness of the inorganic vapor deposition layer 2, it is possible to use the plasma assist method or the ion beam assist method.

Furthermore, in order to increase the transparency of the inorganic vapor deposition layer 2, reactive vapor deposition may be performed by blowing oxygen gas or the like during the vapor deposition.

In the producing method of the gas barrier laminate 20, the coating layer 3 is formed on the inorganic vapor deposition layer 2. The coating layer 3 is formed by coating the inorganic vapor deposition layer 2 with the coating liquid described above, and then drying the formed coating film.

The coating method of the coating liquid is not particularly limited, and examples include coating methods using an air-knife coater, a direct gravure coater, a gravure offset, an arc gravure coater, a reverse roll coater such as a top-feed reverse coater, a bottom-feed reverse coater, or a nozzle-feed reverse coater, a five-roll coater, a lip coater, a bar coater, a bar reverse coater, and a die coater.

The drying method of the coating film is not particularly limited, and examples include a method based on natural drying, a method of drying in an oven set at a predetermined temperature, a method of using a drying machine attached to a coater such as an arch dryer, a floating dryer, a drum dryer or an infrared ray dryer.

The drying conditions can be appropriately selected according to the drying method or the like. For example, in the method of drying in an oven, the drying temperature is preferably in the range of 40 to 150° C., more preferably in the range of 45 to 150° C., and particularly preferably in the range of 50 to 140° C. The drying time varies depending on the drying temperature, but is preferably in the range of 0.5 seconds to 10 minutes, more preferably in the range of 1 second to 5 minutes, and particularly preferably in the range of 1 second to 1 minute.

It is presumed that the carboxyl group-containing polymer (a) contained in the coating film and the polyvalent metal-containing particles (b) react with each other during or after drying to introduce an ionic crosslinked structure. In order to allow the ionic crosslinking reaction to proceed sufficiently, the film after drying is preferably aged for about 1 second to 10 days in an atmosphere with a relative humidity of preferably 20% or more, and more preferably a relative humidity in the range of 40 to 100%, and in an atmosphere with a temperature in the range of preferably 5 to 200° C., and more preferably 20 to 150° C.

The gas barrier laminate obtained in this manner is ionically crosslinked, and therefore has excellent moisture resistance, water resistance, hot water resistance, and water vapor resistance. Further, the gas barrier laminate also has excellent gas barrier properties after processing under a high-temperature and high-humidity environment or a high-temperature and high-pressure environment such as retort treatment or boiling treatment, and exhibits excellent resistance to heavy-duty use that maintains a high level of gas barrier performance even under heavy-duty use such as bending after the above treatment.

<Packaging Material, Packaging Body, and Packaged Article>

The packaging material according to the present embodiment contains the gas barrier laminate described above. The packaging material is used, for example, in the production of a packaging body that packages an article.

A packaging body according to the present embodiment includes the packaging material described above.

The packaging body may consist of the packaging material described above, or may include the packaging material described above and other members. In the former case, the packaging body is, for example, a bag formed from the packaging material described above. In the latter case, the packaging body is, for example, a container including the packaging material described above as a lid, and a closed-bottom cylindrical container body.

In this packaging body, the packaging material described above may be a molded article. As described above, the molded article may be a container such as a bag or part of a container such as a lid. Specific examples of the packaging body or parts thereof include bag products, pouches with spouts, laminated tubes, infusion bags, lids for containers, and paper containers.

There are no particular restrictions on the uses to which the packaging body is applied. The packaging body can be used for packaging various articles.

A packaged article according to the present embodiment includes the packaging body described above, and contents accommodated in the packaging body.

As described above, the gas barrier laminate according to the present embodiment has excellent gas barrier properties and resistance to heavy-duty use even after high-temperature and high-humidity treatment or high-temperature and high-pressure treatment such as boiling treatment and retort treatment. Therefore, a packaging material and a packaging body containing the gas barrier laminate are suitable as a packaging material and a packaging body for an article that easily deteriorates due to the influence of oxygen, water vapor, and the like, and are particularly preferable for use as a packaging material for food products and a packaging body for food products. The packaging materials and the packaging body can also each be preferably used as a packaging material and a packaging body for packaging chemicals such as agricultural chemicals and pharmaceuticals, medical equipment, machine parts, and industrial materials such as precision materials.

When the gas barrier laminate described above is subjected to heat sterilization treatment such as boiling treatment and retort treatment, the gas barrier properties and interlayer adhesion tend to improve rather than deteriorate. Therefore, the packaging material and the packaging body may be a packaging material for heat sterilization and a packaging body for heat sterilization, respectively.

The packaging material for heat sterilization and the packaging body for heat sterilization are used to package articles that are subjected to heat sterilization treatment after packaging.

Examples of articles that are subjected to heat sterilization treatment after packaging include food products such as curry, stew, soup, sauce and processed meat products.

Examples of the heat sterilization treatment include boiling treatment and retort treatment.

Boiling treatment is a treatment where moist-heat sterilization is performed in order to preserve food products and the like. In boiling treatment, depending on the contents, a packaged article in which contents such as food is packaged in the packaging body described above is normally subjected to wet heat sterilization treatment at a temperature of 60 to 100° C. under atmospheric pressure for 10 to 120 minutes. Normally, boiling treatment is performed using a hot water bath. Boiling treatment includes batch type treatment, in which a packaged article is immersed in a hot water bath at a constant temperature and taken out after a certain period of time, and continuous type treatment in which the packaged article is sterilized by passing it through a hot water bath tunnel.

Retort treatment is typically treatment in which pressure and heat sterilization is performed to kill microorganisms such as mold, yeast, and bacteria in order to preserve a food product or the like. In retort treatment, the packaged article in which a food product is packaged in the packaging body described above is usually subjected to pressure sterilization and heat treatment at a pressure of 0.15 to 0.3 MPa and a temperature of 105 to 140° C. for 10 to 120 minutes. Retort devices include steam type devices using heated steam, and hot water type devices using pressurized superheated water, and these devices are used as appropriate according to the sterilization conditions of the food product or the like representing the contents.

EXAMPLES

Specific examples of the present invention will be described below.

Preparation of Coating Liquid

Comparative Example 1: Coating Liquid 1-1

The carboxyl group-containing polymer was heated and dissolved in isopropanol. Polyacrylic acid (PAA) (JURYMER (registered trademark) AC-10LP manufactured by Toagosei Co., Ltd., number average molecular weight 50,000) was used as the carboxyl group-containing polymer. A polyacrylic acid solution containing polyacrylic acid at a concentration of 10% by mass was prepared as described above.

First, 1.8 g of polyether phosphate ester (DISPARLON (registered trademark) DA-375 manufactured by Kusumoto Kasei Co., Ltd., solid content: 100% by mass) was dissolved in 26.2 g of isopropanol. Then, 12 g of zinc oxide (FINEX-30 (registered trademark) manufactured by Sakai Chemical Industry Co., Ltd.) having an average primary particle size of 35 nm was added to the mixture and stirred. The resulting liquid was subjected to dispersion treatment for 1 hour using a planetary ball mill (P-7 manufactured by Fritsch GmbH). Zirconia beads with a diameter of 0.2 mm were used for the dispersion treatment. Then, the beads were sieved from the liquid to obtain a dispersion liquid containing zinc oxide at a concentration of 30% by mass.

Next, 50.00 g of the polyacrylic acid (PAA) solution, 3.77 g of the zinc oxide dispersion, 0.10 g of a silane coupling agent (SC agent) serving as the silicon-containing compound (KBM-403, manufactured by Shin-Etsu Chemical Co., Ltd., 3-glycidoxypropyltrimethoxysilane), and 22.86 g of isopropanol were mixed to prepare coating liquid 1-1. In coating liquid 1-1, the equivalence ratio ($b_t/a_t$) of the product ($b_t$) of the number of moles and the valency of a zinc contained in the zinc oxide relative to the number of moles ($a_t$) of carboxyl groups contained in the polyacrylic acid (PAA) was 0.4, and the molar ratio ($d_t/a_t$) of the number of moles ($d_t$) of the SC agent relative to the number of moles ($a_t$) of the carboxyl groups contained in the polyacrylic acid (PAA) was 0.6%.

Comparative Examples 2 to 4: Coating Liquids 1-2 to 1-4

Coating liquids 1-2 to 1-4 were prepared in the same manner as described above for coating liquid 1-1, except that the amount of SC agent added was changed as shown in Table 1. Table 1 shows the equivalence ratio ($b_t/a_t$) and the molar ratio ($d_t/a_t$) of each coating liquid.

Comparative Example 5: Coating Liquid 2-1

Coating liquid 2-1 was prepared in the same manner as described above for coating liquid 1-1, except that the amount of zinc oxide dispersion added was changed to 4.71 g, and the amount of isopropanol added was changed to 25.45 g. In coating liquid 2-1, the equivalence ratio ($b_t/a_t$) was 0.5, and the molar ratio ($d_t/a_t$) was 0.6%.

Examples 1 and 2, Comparative Example 6: Coating Liquids 2-2 to 2-4

Coating liquids 2-2 to 2-4 were prepared in the same manner as described above for coating liquid 2-1, except that the amount of SC agent added was changed as shown in Table 1. Table 1 shows the equivalence ratio ($b_t/a_t$) and the molar ratio ($d_t/a_t$) of each coating liquid.

Comparative Example 7: Coating Liquid 3-1

Coating liquid 3-1 was prepared in the same manner as described above for coating liquid 1-1, except that the amount of zinc oxide dispersion added was changed to 7.54 g, and the amount of isopropanol added was changed to 33.22 g. In coating liquid 3-1, the equivalence ratio ($b_t/a_t$) was 0.8, and the molar ratio ($d_t/a_t$) was 0.6%.

Examples 3 and 4, Comparative Example 8: Coating Liquids 3-2 to 3-4

Coating liquids 3-2 to 3-4 were prepared in the same manner as described above for coating liquid 3-1, except that the amount of SC agent added was changed as shown in Table 1. Table 1 shows the equivalence ratio ($b_t/a_t$) and the molar ratio ($d_t/a_t$) of each coating liquid.

Comparative Example 9: Coating Liquid 4-1

Coating liquid 4-1 was prepared in the same manner as described above for coating liquid 1-1, except that the amount of zinc oxide dispersion added was changed to 9.42 g, and the amount of isopropanol added was changed to 38.40 g. In coating liquid 4-1, the equivalence ratio ($b_t/a_t$) was 1.0, and the molar ratio ($d_t/a_t$) was 0.6%.

Comparative Examples 10 to 12: Coating Liquids 4-2 to 4-4

Coating liquids 4-2 to 4-4 were prepared in the same manner as described above for coating liquid 4-1, except that the amount of SC agent added was changed as shown in Table 1. Table 1 shows the equivalence ratio ($b_t/a_t$) and the molar ratio ($d_t/a_t$) of each coating liquid.

TABLE 1

| | Coating liquid | PAA solution (g) | ZnO dispersion (g) | SC agent (g) | Isopropanol (g) | Zn/COOH (equivalence ratio $b_t/a_t$) | SC agent/COOH (molar ratio $d_t/a_t$) |
|---|---|---|---|---|---|---|---|
| Comparative Example 1 | 1-1 | 50.00 | 3.77 | 0.10 | 22.86 | 0.4 | 0.6% |
| Comparative Example 2 | 1-2 | 50.00 | 3.77 | 0.15 | 22.86 | | 0.9% |
| Comparative Example 3 | 1-3 | 50.00 | 3.77 | 1.00 | 22.86 | | 6.1% |
| Comparative Example 4 | 1-4 | 50.00 | 3.77 | 1.25 | 22.86 | | 7.6% |
| Comparative Example 5 | 2-1 | 50.00 | 4.71 | 0.10 | 25.45 | 0.5 | 0.6% |
| Example 1 | 2-2 | 50.00 | 4.71 | 0.15 | 25.45 | | 0.9% |
| Example 2 | 2-3 | 50.00 | 4.71 | 1.00 | 25.45 | | 6.1% |
| Comparative Example 6 | 2-4 | 50.00 | 4.71 | 1.25 | 25.45 | | 7.6% |
| Comparative Example 7 | 3-1 | 50.00 | 7.54 | 0.10 | 33.22 | 0.8 | 0.6% |
| Example 3 | 3-2 | 50.00 | 7.54 | 0.15 | 33.22 | | 0.9% |
| Example 4 | 3-3 | 50.00 | 7.54 | 1.00 | 33.22 | | 6.1% |
| Comparative Example 8 | 3-4 | 50.00 | 7.54 | 1.25 | 33.22 | | 7.6% |
| Comparative Example 9 | 4-1 | 50.00 | 9.42 | 0.10 | 38.40 | 1.0 | 0.6% |
| Comparative Example 10 | 4-2 | 50.00 | 9.42 | 0.15 | 38.40 | | 0.9% |
| Comparative Example 11 | 4-3 | 50.00 | 9.42 | 1.00 | 38.40 | | 6.1% |
| Comparative Example 12 | 4-4 | 50.00 | 9.42 | 1.25 | 38.40 | | 7.6% |

<Production of Gas Barrier Laminate>

(Preparation of Anchor Coat Liquid)

First, 5 parts by mass of acrylic polyol was mixed with 1 part by mass of 7-isocyanatopropyltrimethoxysilane in a dilution solvent (ethyl acetate), and then stirred. Then, tolylene diisocyanate (TDI) was added as an isocyanate compound so that the amount of NCO groups was equal to the amount of OH groups of the acrylic polyol. Anchor coat liquid 1 was obtained by diluting the resulting mixed solution with the dilution solvent to a concentration of 2% by mass.

As the acrylic polyol, GS-5756 manufactured by Mitsubishi Rayon Co., Ltd. was used.

Example 101

Anchor coating liquid 1 was applied to one surface of a biaxially stretched polypropylene film (trade name: ME-1, manufactured by Mitsui Chemicals Tohcello, Inc., thickness: 20 μm) using a bar coater so that the thickness after drying was 0.2 μm, and the anchor coat layer was formed by drying the coating at 150° C. for 1 minute.

On the anchor coat layer, silicon was vaporized by a vacuum vapor deposition device using an electron beam heating system, and then oxygen gas was introduced to perform vapor deposition of silicon oxide (SiO) to form an inorganic vapor deposition layer having a thickness of 20 nm.

Coating liquid 2-2 was applied on the inorganic vapor deposition layer using a bar coater (wire bar). The coating film was dried in an oven at 50° C. for 1 minute to form a coating layer having a thickness of 400 nm. A laminate 1 was obtained as described above. In addition, the film thickness of the coating layer was measured by a method mentioned later.

Examples 102 to 104

The multilayer bodies 2, 3 and 4 were produced in the same manner as in laminate 1 of Example 101, except that coating liquid 2-2 was changed to coating liquids 2-3, 3-2, and 3-3.

Examples 105 and 106

The multilayer bodies 5 and 6 were produced in the same manner as the laminate 3 of Example 103, except that the thickness of the coating layer was changed from 400 nm to 230 nm or 600 nm.

Comparative Examples 101 to 112

The multilayer bodies 1C to 12C were produced in the same manner as in laminate 1 of Example 101, except that coating liquid 2-2 was changed to coating liquids 1-1 to 1-4, 2-1, 2-4, 3-1, 3-4, and 4-1 to 4-4.

<Measurement of Film Thickness of Coating Layer>

Each obtained laminate was embedded with an embedding resin, the cross section was exposed with a microtome, and the cross section of the laminate was observed using a scanning electron microscope (SEM). From the obtained SEM image, the thickness of the coating layer in a flat portion was measured at 10 points, and the average value was taken as the thickness of the coating layer.

Evaluations

[Oxygen Permeability after Retort Treatment]

Each obtained laminate was cut into a size of 20 cm×20 cm, and was subjected to retort treatment at 0.2 MPa and 120° C. for 30 minutes using a hot water storage type retort pot. The oxygen permeability of each sample after retort treatment was measured using an oxygen permeability tester, OXTRAN (registered trademark) 2/20, manufactured by Modern Control Inc. at a temperature of 30° C. and a relative humidity of 70%. The measurement method conformed to the method of JIS K-7126 B (isobaric method) and ASTM D3985, and the measured value was expressed in units of cc/m$^2$/day/atm. A sample with an oxygen permeability of 10 cc/m$^2$/day/atm or less received an A rating, and a sample with an oxygen permeability of more than 10 cc/m$^2$/day/atm received a B rating. When the oxygen permeability was 10 cc/m$^2$/day/atm or less, the laminate had the desired gas barrier properties after treatment at high temperature and high pressure and after treatment at high temperature and high humidity. The results are shown in Table 2.

[Oxygen Permeability after Retort Treatment and Heavy-Duty Testing by Bending]

Each laminate after the retort testing described above was subjected to bending five times with a Gelbo flex tester manufactured by Tester Sangyo Co., Ltd. as specified in MIL B131 (ASTMF392). The oxygen permeability of each laminate after the heavy-duty testing was measured under the same conditions and method as described above. A sample with an oxygen permeability of 10 cc/m$^2$/day/atm or less received an A rating, and a sample with an oxygen permeability of more than 10 cc/m$^2$/day/atm received a B rating. When the oxygen permeability was 10 cc/m$^2$/day/atm or less, the laminate was capable of withstanding treatment under a high-temperature and high-humidity environment and under a high-temperature and high-pressure environment, was capable of maintaining a high level of gas barrier performance even when subjected to heavy-duty use thereafter, and had excellent resistance to heavy-duty use. The results are shown in Table 2.

TABLE 2

| | Multilayer body | Inorganic vapor deposition layer | Coating layer: Coating liquid | Coating layer: Zn/COOH (equivalence ratio $b_t/a_t$) | Coating layer: SC agent/COOH (molar ratio $d_t/a_t$) | Coating layer: Film thickness [nm] | Oxygen permeability [cc/m$^2$/day/atm]: After retort treatment | Rating | Oxygen permeability [cc/m$^2$/day/atm]: After heavy-duty use test | Rating |
|---|---|---|---|---|---|---|---|---|---|---|
| Comparative Example 101 | 1C | SiO | 1-1 | 0.4 | 0.6% | 400 | 13.0 | B | 30.0 | B |
| Comparative Example 102 | 2C | SiO | 1-2 | | 0.9% | 400 | 12.0 | B | 22.0 | B |
| Comparative Example 103 | 3C | SiO | 1-3 | | 6.1% | 400 | 15.0 | B | 23.0 | B |
| Comparative Example 104 | 4C | SiO | 1-4 | | 7.6% | 400 | 30.0 | B | 35.0 | B |
| Comparative Example 105 | 5C | SiO | 2-1 | 0.5 | 0.6% | 400 | <10 | A | 20.0 | B |
| Example 101 | 1 | SiO | 2-2 | | 0.9% | 400 | <10 | A | <10 | A |
| Example 102 | 2 | SiO | 2-3 | | 6.1% | 400 | <10 | A | <10 | A |
| Comparative Example 106 | 6C | SiO | 2-4 | | 7.6% | 400 | 25.0 | B | 33.0 | B |
| Comparative Example 107 | 7C | SiO | 3-1 | 0.8 | 0.6% | 400 | <10 | A | 25.0 | B |
| Example 103 | 3 | SiO | 3-2 | | 0.9% | 400 | <10 | A | <10 | A |
| Example 104 | 4 | SiO | 3-3 | | 6.1% | 400 | <10 | A | <10 | A |
| Comparative Example 108 | 8C | SiO | 3-4 | | 7.6% | 400 | 23.0 | B | 40.0 | B |
| Comparative Example 109 | 9C | SiO | 4-1 | 1 | 0.6% | 400 | <10 | A | 46.0 | B |
| Comparative Example 110 | 10C | SiO | 4-2 | | 0.9% | 400 | <10 | A | 41.0 | B |
| Comparative Example 111 | 11C | SiO | 4-3 | | 6.1% | 400 | <10 | A | 28.0 | B |
| Comparative Example 112 | 12C | SiO | 4-4 | | 7.6% | 400 | 20.0 | B | 52.0 | B |
| Example 105 | 5 | SiO | 3-2 | 0.8 | 0.9% | 230 | <10 | A | <10 | A |
| Example 106 | 6 | SiO | 3-2 | | 0.9% | 600 | <10 | A | <10 | A |

As shown in Table 2, it can be seen that the multilayer bodies 1 to 6 (Examples 101 to 106) according to the present embodiment not only had excellent gas barrier properties under high-temperature and high-humidity treatment and under high-temperature and high-pressure treatment, but also had excellent resistance to heavy-duty use that enabled a high level of gas barrier performance to be maintained even when subjected to heavy-duty use such as bending thereafter.

The present invention is not limited to the embodiments described above, but may be modified in various ways when implemented, without departing from the spirit of the present invention. Furthermore, the embodiments may be appropriately combined when implemented, and in this case, a combination of the advantageous effects is obtained. The embodiments described above include various inventions, and various inventions can be extracted from combinations selected from a plurality of disclosed constituent elements. For example, even if some constituent elements are eliminated from all the constituent elements disclosed in the embodiments, configurations with these constituent elements eliminated can be interpreted to be within the scope of the invention as long as the problems can be solved and the advantageous effects can be obtained.

REFERENCE SIGNS LIST

1 . . . Substrate; 2 . . . Inorganic vapor deposition layer; 3 . . . Coating layer; 4 . . . Anchor coat layer; 10, 20 . . . Gas barrier laminate.

What is claimed is:

1. A gas barrier laminate comprising a substrate, an inorganic vapor deposition layer, which contains an inorganic oxide, and a coating layer provided in this order on at least one primary surface of the substrate, wherein the coating layer contains a carboxyl group-containing polymer (a), polyvalent metal-containing particles (b), a surfactant (c), and a silicon-containing compound (d), the silicon-containing compound (d) is at least one selected from a group consisting of silane coupling agents represented by general formulas (1) and (2) below, and hydrolysates and condensates thereof, an equivalence ratio ($b_t/a_t$) of a product ($b_t$) of a number of moles and a valency of a polyvalent metal contained in the polyvalent metal particles (b) relative to a number of moles ($a_t$) of carboxyl groups contained in the carboxyl group-containing polymer (a) is 0.45 or more and 0.9 or less, and a molar ratio ($d_t/a_t$) of a number of moles ($d_t$) of the silicon-containing compound (d) relative to a number of moles ($a_t$) of the carboxyl groups is 0.7% or more and 7.5% or less, dt in the molar ratio ($d_t/a_t$) being the number of moles of the silicon-containing compound (d) when converted to the silane coupling agent, $$Si(OR_1)_3Z_1 \quad (1)$$

$$Si(R_2)(OR_3)_2Z_2 \quad (2)$$

(wherein, in general formula 1, $R_1$ is an alkyl group having 1 to 6 carbon atoms, which may be the same or different, and $Z_1$ is a group containing an epoxy group, and in general formula (2), $R_2$ is a methyl group, $R_3$ is an alkyl group having 1 to 6 carbon atoms, which may be the same or different, and $Z_2$ is a group containing an epoxy group).

2. The gas barrier laminate according to claim 1, wherein the carboxyl group-containing polymer (a) contains at least a structural unit derived from at least one type of α,β-monoethylenically unsaturated carboxylic acid selected from a group consisting of acrylic acid, methacrylic acid, crotonic acid, itaconic acid, maleic acid, and fumaric acid.

3. The gas barrier laminate according to claim 1, wherein a polyvalent metal contained in the polyvalent metal-containing particles (b) is a divalent metal.

4. The gas barrier laminate according to claim 1, wherein a film thickness of the coating layer is 230 nm or more and 600 nm or less.

5. The gas barrier laminate according to claim 1, further comprising an anchor coat layer between the substrate and the inorganic vapor deposition layer.

6. The gas barrier laminate according to claim 2, wherein the polymer (a) is at least one selected from the group consisting of polyacrylic acid, polymethacrylic acid, and polymaleic acid.

7. The gas barrier laminate according to claim 2, wherein the polymer (a) is polyacrylic acid.

8. The gas barrier laminate according to claim 3, wherein the polyvalent metal is zinc.

9. The gas barrier laminate according to claim 3, wherein the polyvalent metal-containing particles (b) are zinc oxide.

10. The gas barrier laminate according to claim 3, wherein the polyvalent metal is magnesium.

11. The gas barrier laminate according to claim 1, wherein the silicon-containing compound (d) is 3-glycidoxypropyltrimethoxysilane.

12. The gas barrier laminate according to claim 1, wherein the surfactant (c) is a phosphate ester-based surfactant.

13. The gas barrier laminate according to claim 1, wherein the inorganic oxide is silicon oxide.

14. The gas barrier laminate according to claim 1, wherein the inorganic oxide is aluminum oxide.

15. The gas barrier laminate according to claim 1, wherein the substrate comprises a polyolefin resin.

16. The gas barrier laminate according to claim 15, wherein the substrate is a biaxially stretched polypropylene film.

17. The gas barrier laminate according to claim 1, wherein the substrate comprises a polyester-based resin.

18. The gas barrier laminate according to claim 1, wherein the substrate comprises a polyamide-based resin.

19. The gas barrier laminate according to claim 4, wherein a film thickness of the coating layer is 270 nm or more and 520 nm or less.

20. The gas barrier laminate according to claim 19, wherein a film thickness of the coating layer is 300 nm or more and 450 nm or less.

* * * * *